United States Patent
Zhang et al.

(10) Patent No.: US 7,221,547 B2
(45) Date of Patent: May 22, 2007

(54) MAGNETORESISTIVE EFFECT ELEMENT, A MAGNETIC HEAD, AND A MAGNETIC REPRODUCING APPARATUS THEREWITH

(75) Inventors: Yiqun Zhang, Nagano (JP); Hideyuki Kikuchi, Kawasaki (JP); Masashige Sato, Kawasaki (JP); Kazuo Kobayashi, Kawasaki (JP); Hitoshi Kanai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/465,820

(22) Filed: Jun. 19, 2003

(65) Prior Publication Data

US 2004/0070889 A1    Apr. 15, 2004

Related U.S. Application Data

(63) Continuation of application No. PCT/JP00/09107, filed on Dec. 21, 2000.

(51) Int. Cl.
G11B 5/127    (2006.01)

(52) U.S. Cl. .................................. 360/324.2

(58) Field of Classification Search .......... 360/324.2, 360/324.11, 324.12, 324.1; 428/336, 692; 365/171, 173, 158
See application file for complete search history.

(56) References Cited

U.S. PATENT DOCUMENTS

| | | | |
|---|---|---|---|
| 5,640,343 A | | 6/1997 | Gallagher et al. .......... 365/171 |
| 5,768,066 A | | 6/1998 | Akiyama et al. |
| 5,901,018 A | * | 5/1999 | Fontana et al. .......... 360/324.2 |
| 6,034,887 A | | 3/2000 | Gupta et al. ................. 365/171 |
| 6,114,719 A | * | 9/2000 | Dill et al. .................... 257/295 |
| 6,124,711 A | | 9/2000 | Tanaka et al. ............... 324/252 |
| 6,127,045 A | * | 10/2000 | Gill ............................ 428/611 |
| 6,153,320 A | | 11/2000 | Parkin ........................ 428/693 |
| 6,178,074 B1 | * | 1/2001 | Gill ........................... 360/324.2 |
| 6,469,926 B1 | * | 10/2002 | Chen .......................... 365/158 |
| 6,473,279 B2 | * | 10/2002 | Smith et al. ........... 360/324.12 |
| 6,504,688 B2 | * | 1/2003 | Hasegawa et al. ..... 360/324.11 |
| 6,563,682 B1 | * | 5/2003 | Sugawara et al. ........ 360/324.2 |
| 6,600,638 B2 | * | 7/2003 | Gill ........................ 360/324.11 |
| 6,611,405 B1 | * | 8/2003 | Inomata et al. .......... 360/324.2 |
| 6,710,984 B1 | * | 3/2004 | Yuasa et al. ........... 360/324.11 |
| 6,714,444 B2 | * | 3/2004 | Huai et al. .................. 365/171 |
| 6,721,147 B2 | * | 4/2004 | Aoshima et al. ........ 360/324.12 |
| 6,724,586 B2 | * | 4/2004 | Gill .......................... 360/324.2 |
| 6,741,433 B1 | * | 5/2004 | Nishioka .................. 360/324.2 |
| 6,751,073 B2 | * | 6/2004 | Hasegawa ................ 360/324.2 |
| 6,751,074 B2 | * | 6/2004 | Inomata et al. .......... 360/324.2 |
| 6,759,120 B2 | * | 7/2004 | Jongill et al. ............... 428/336 |
| 6,765,770 B2 | * | 7/2004 | Dee ....................... 360/324.12 |
| 7,016,170 B2 | * | 3/2006 | Nishioka .................. 360/324.2 |

FOREIGN PATENT DOCUMENTS

EP    0 777 214 A2    6/1997

(Continued)

*Primary Examiner*—Allen Cao
(74) *Attorney, Agent, or Firm*—Greer, Burns & Crain, Ltd.

(57) ABSTRACT

A magnetoresistive effect element is a compound lamination including a first anti-ferromagnetic layer, a first fixed magnetic layer, a tunnel insulation layer, a free magnetic layer, a non-magnetic metal layer, a second fixed magnetic layer, and a second anti-ferromagnetic layer such that a TMR element and a SVMR element are formed, sharing the free magnetic layer.

10 Claims, 8 Drawing Sheets

FOREIGN PATENT DOCUMENTS

| | | |
|---|---|---|
| EP | 0 843 368 | 5/1998 |
| EP | 0 845 820 A2 | 6/1998 |
| EP | 0 953 849 | 11/1999 |
| EP | 0 971 423 A1 | 1/2000 |
| GB | 2 333 900 A | 8/1999 |
| JP | 11-328624 | 11/1999 |
| JP | 2000-242913 | 9/2000 |

\* cited by examiner

MAGNETORESISTIVE EFFECT ELEMENT, A MAGNETIC HEAD, AND A MAGNETIC REPRODUCING APPARATUS THEREWITH

This is a continuation of International PCT Application No. PCT/JP00/09107 filed Dec. 21, 2000.

TECHNICAL FIELD

The present invention generally relates to a high sensitivity magnetoresistive element, and especially relates to a magnetoresistive effect element that combines a tunnel type magnetoresistive effect element (TMR element) and a spin valve type magnetoresistive effect element (SVMR element).

BACKGROUND ART

In recent years, recording density of magnetic memory media has been remarkably increasing. For example, the surface recording density of a hard disk drive unit has been doubling each year, and it is considered that the spin valve type magnetoresistive effect head currently in use will reach the limit of its reproduction capability in the near future. Therefore, it is necessary to develop a magnetic effect element with higher sensitivity, which can form a magnetic head.

In a situation like this, the tunnel type magnetoresistive effect type head (TMR head) is considered indispensable as a promising candidate for a next-generation leading head, where a recording density of 100 Gbit/square inch is to be realized. The TMR head can provide a high MR ratio (40% or higher), and a reproduction output that is several times as high as the existing spin valve type magnetoresistive effect head (SVMR head), etc.

Although there are trial production reports concerning TMR heads from a plurality of companies, the surface recording density of the TMR head has not yet reached a satisfactory level according to these reports. The TMR elements that have been made so far have junction resistance values ranging between approximately 20 and 40 $\Omega/\mu m^2$, and MR ratios ranging between approximately 7 and 20%, which are not satisfactory to realize a magnetoresistive element that fully utilizes the real strength of a TMR element.

Further, since the junction area of the TMR element to be included in a magnetic head becomes smaller as the surface recording density of a magnetic record reproducing apparatus becomes higher, if junction resistance of a TMR element stays as it is at the present, the resistance of the magnetic head becomes greater rapidly. Because of this, problems arise, such as degradation of S/N, an increase in delay, etc., and accurate operations of the magnetic head become difficult.

DISCLOSURE OF INVENTION

The inventor of the present invention et al. have confirmed through a trial production and checking that the junction resistance of a TMR element can be lowered by making a tunnel insulation layer thin, and carrying out a weak oxidization process. FIG. 1A through FIG. 1C show junction resistance values of the tunnel insulation layer formed by oxidizing an aluminum layer under various oxidization conditions. The figures show relations between areas S and junction resistance values R, with the horizontal axis representing the areas S ($\mu m^2$), and the vertical axis representing the junction resistance values R ($\Omega$). The thickness of the aluminum layer is 1.0 nm in FIG. 1A, 0.9 nm in FIG. 1B, and 0.8 nm in FIG. 1C. Oxidization conditions for forming the tunnel insulation layer are as indicated in the figures.

In the trial production of the TMR element, a lamination of

Cr(10)/Au(30)/NiFe(4)/CoFe(3)/AlOx/CoFe(2.5)/IrMn(15)/Au(20) was used. The numeral values in the parenthesis are thickness in nm of each layer.

From FIG. 1A through FIG. 1C, it is deduced that the junction resistance R of a TMR element becomes lower as the tunnel insulation layer is made thin, and as the oxidization processing is weakened by lowering the pressure of $O_2$(Pa) and by shortening the oxidization period. For example, in the case of FIG. 1C, where the TMR element was produced by 0.8 nm thick aluminum under 3000 Pa and natural oxidization for 30 minutes, the surface resistance is lowered to approximately 4 $\Omega/\mu m^2$.

However, as the tunnel insulation layer is made thin and weak oxidization is carried out, the MR ratio falls. FIG. 2A through FIG. 2C show magnetoresistive changes (MR) of the TMR elements that have the tunnel insulation layers of FIG. 1A through FIG. 1C, respectively. The figures show relations between areas S and MR ratios, with the vertical axis representing the MR ratios (%), and the horizontal axis representing the areas S ($\mu m^2$). In the case of the element that gives the surface resistance of 4 $\Omega/\mu m^2$ as explained with reference to FIG. 1C, the MR ratio is seen to be about 9% with reference to FIG. 2C, which means that a resistance change of only about 0.36 $\Omega$ is obtained.

As mentioned above, the TMR element, which uses a tunnel insulation layer, is required to have a low junction resistance value in order to obtain high recording density. However, if the tunnel insulation layer is made too thin, and only weak oxidization is carried out in order to lower the junction resistance, the MR ratio is degraded. Thus, in order for a TMR device to play the role of the next-generation lead head, it is necessary to form the TMR element such that both a desired resistance change and a low junction resistance be obtained at the same time.

Further, a TMR element has voltage dependency, which is a tendency of the MR ratio to rapidly decrease with an increase in the voltage that is applied. For example, if a voltage of 400 mV is applied to a TMR element, the MR ratio may decrease to about a half, as compared with an MR ratio when 0 bias is applied. Therefore, although it is desirable that the voltage applied be high to a certain extent in order to obtain high sensitivity when reproducing recorded magnetic data from a magnetic recording medium, such as a hard disk, the voltage has to be suppressed when a TMR element is used.

Furthermore, it is pointed that an electric short circuit tends to occur during a lapping (Mechanical Lapping) process when actually manufacturing a magnetic head that employs a TMR element. In order to cope with this problem, there is a proposal that a magnetic flux guide (henceforth, flux guide) be used, which is a part of a free magnetic layer that constitutes the TMR element, the part being projected toward the magnetic recording medium. This proposal of using the flux guide structure can suppress occurrence of a short circuit between the free magnetic layer and a fixed magnetic layer, when polishing is carried out by a lapping process. However, if the flux guide structure is used, reproduction output from the magnetic head decreases. For example, the reproduction output will decrease to about a half if the height (the amount of projection) of the flux guide exceeds 0.2 μm. In order to maintain the reproduction output, the height of the flux guide has to be 0.1 μm or less. However, it is difficult to carry out the lapping process with an accuracy of 0.1 μm.

Accordingly, the objective of the present invention is to provide a highly sensitive magnetoresistive effect element that employs a TMR element.

The objective is attained by a composite type magnetoresistive effect element (TMR-SVMR element) that is based on a compound lamination, wherein a TMR element and a SVMR element share a free magnetic layer.

Namely, the objective is attained by the magnetoresistive effect element containing the lamination of a first anti-ferromagnetic layer, a first fixed magnetic layer, a tunnel insulation layer, a free magnetic layer, a non-magnetic metal layer, a second fixed magnetic layer, and a second anti-ferromagnetic layer.

The composite type magnetoresistive effect element includes a TMR element part that includes the first anti-ferromagnetic layer, the first fixed magnetic layer, the tunnel insulation layer, and the free magnetic layer; and a SVMR element part that includes the free magnetic layer, the non-magnetic metal layer, the second fixed magnetic layer, and the second anti-ferromagnetic layer.

In this manner, the problem of the conventional TMR element is compensated for by the SVMR element part, and a higher density magnetoresistive effect element can be provided. That is, with the TMR-SVMR element of the present invention, the tunnel insulation layer of the TMR element can be made thin, and a voltage applied for detecting external magnetic data is shared by the TMR element part and the SVMR element part, thus the voltage dependency of the TMR is alleviated.

Further, it is desirable that a flux guide be provided to the free magnetic layer of the TMR-SVMR element. Since the SVMR element part is formed in one body, even if the flux guide structure is provided to the free magnetic layer, the degradation of the reproduction output, the problem with the conventional TMR element, can be compensated for, and a magnetoresistive effect element with high sensitivity can be attained.

Further, it is desirable that the non-magnetic metal layer, the second fixed magnetic layer, and the second anti-ferromagnetic layer, which are components of the SVMR element part, be formed in a shape that corresponds to the shape of the flux guide of the free magnetic layer.

Since the short circuit between the free magnetic layer and the second fixed magnetic layer does not pose a problem on the SVMR element side, unlike the TMR element side, a lapping process can be employed to polish from the free magnetic layer to the second anti-ferromagnetic layer. Further, since the SVMR element is present in the flux guide part, even if the height (the amount of projection) of the flux guide becomes great to a certain extent, the external magnetic data can be detected with high precision. Therefore, the highly precise control required for making the height of the flux guide to be lower than 0.1 μm in the lapping process becomes unnecessary.

Furthermore, concerning the TMR-SVMR element of the present invention, at least the first fixed magnetic layer can be bisected in the direction of the surface of the free magnetic layer, with the position of the flux guide being in the middle.

This formation makes a triple composite type magnetoresistive effect element (TMR-SVMR-TMR element), wherein a first TMR element part and a second TMR element part are formed on opposing sides of the free magnetic layer, with the position of the flux guide of the free magnetic layer being in the center, and the SVMR element part is formed at the position of the flux guide of the free magnetic layer.

Since this TMR-SVMR-TMR element detects external magnetic data with the three magnetoresistive effect elements, high sensitivity is available. The tunnel insulation layer of the TMR element of the TMR-SVMR-TMR element can be made thin. Sense current applied in order to detect the external magnetic data flows perpendicularly through the lamination surface of the first TMR element part, flows in the direction of the surface (horizontal) in the SVMR element part, and flows perpendicularly through the second TMR element part to the lamination surface. Therefore, the voltage applied is approximately equally shared by the three element parts, and the voltage dependency of the TMR is alleviated.

As for this TMR-SVMR-TMR element, it is desirable that the non-magnetic metal layer, the second fixed magnetic layer, and the second anti-ferromagnetic layer, which are included in the SVMR element, are formed in a shape that corresponds to the form of the flux guide of the free magnetic layer.

As for the TMR-SVMR element that can be realized in a plurality of formations, as described above, the SVMR element can be made a specular type (i.e., mirror reflective structure) by forming an oxidized layer in the direction of the surface (i.e., horizontally), such that electrons of the free magnetic layer are reflected, thereby the sensitivity of the magnetoresistive effect element is further improved.

An apparatus suitable for high recording density as required recently can be realized by making a magnetic head using the TMR-SVMR element of the present invention, as described above, since the signal magnetic field (external magnetic data) from a magnetic recording medium is reproducible with high sensitivity.

BEST MODE FOR CARRYING OUT THE INVENTION

Figure 1A:
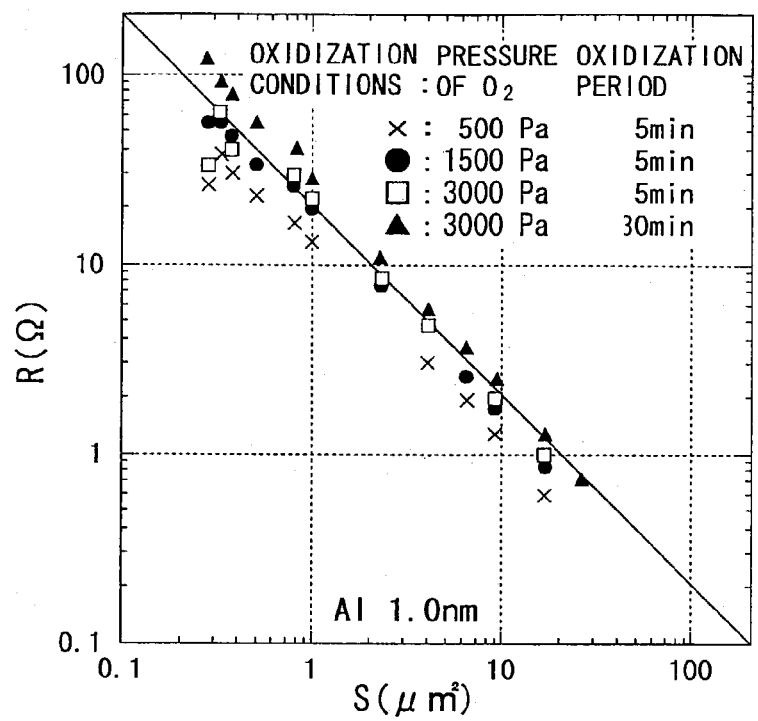
FIG. 1A through FIG. 1C show junction resistances of a tunnel insulation layer formed by oxidizing an Al layer, with varied oxidization conditions.
Figure 1B:
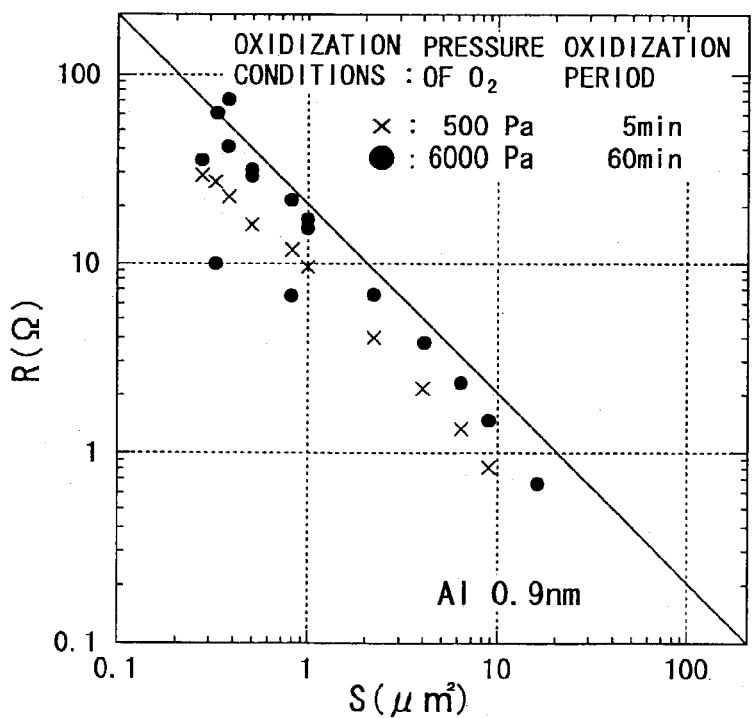
Figure 1C:
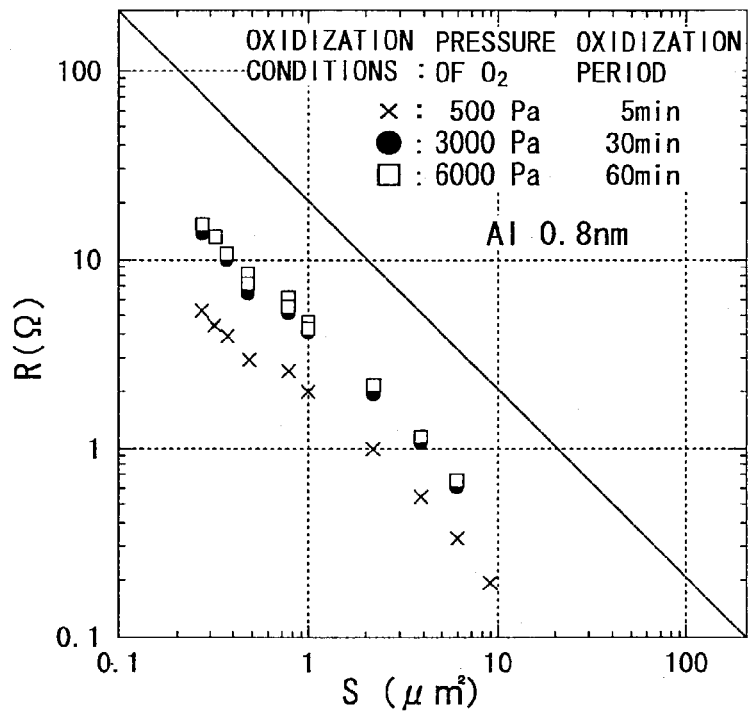
Figure 2A:
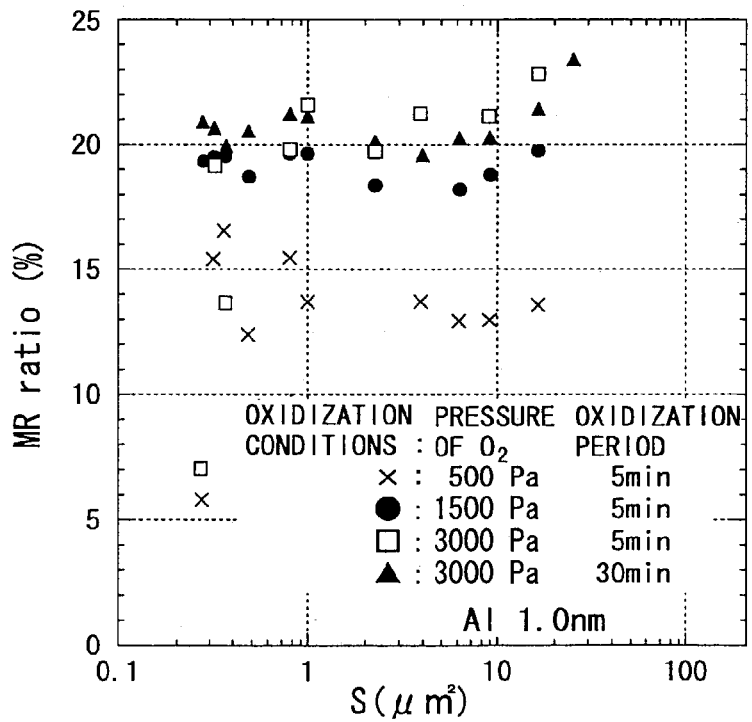
FIG. 2A through FIG. 2C show magnetoresistive change (MR) of a TMR element that has the tunnel insulation layer, junction resistances of which are as shown by FIG. 1A through FIG. 1C, respectively.
Figure 2B:
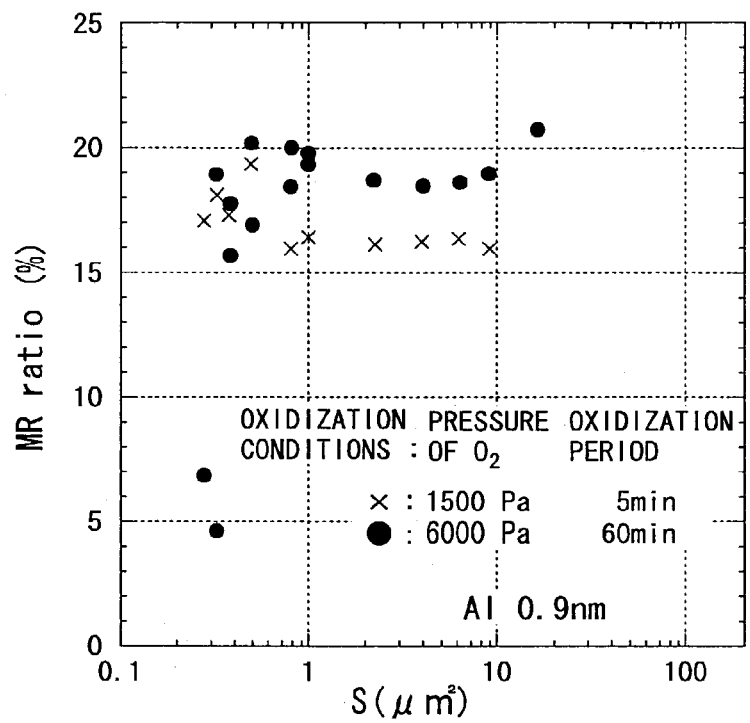
Figure 2C:
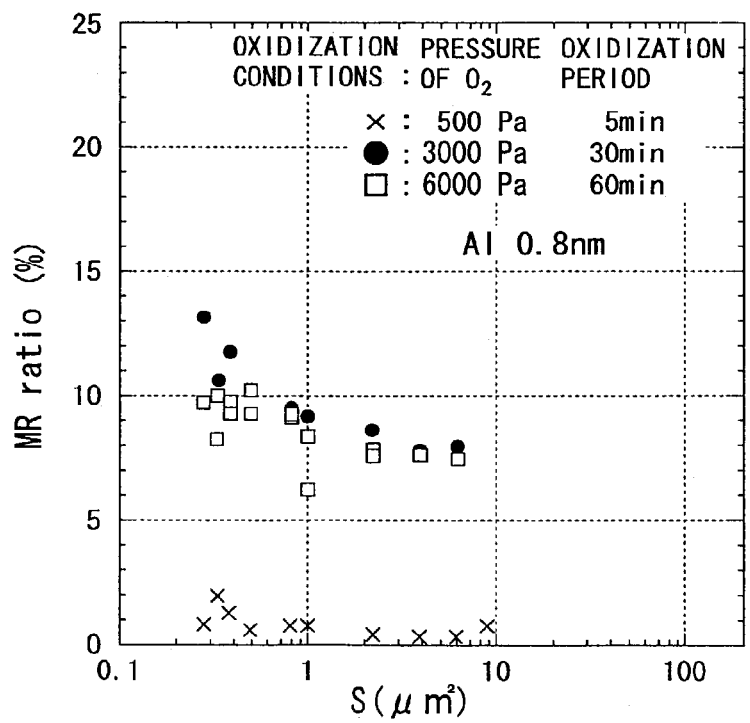
Figure 3A:
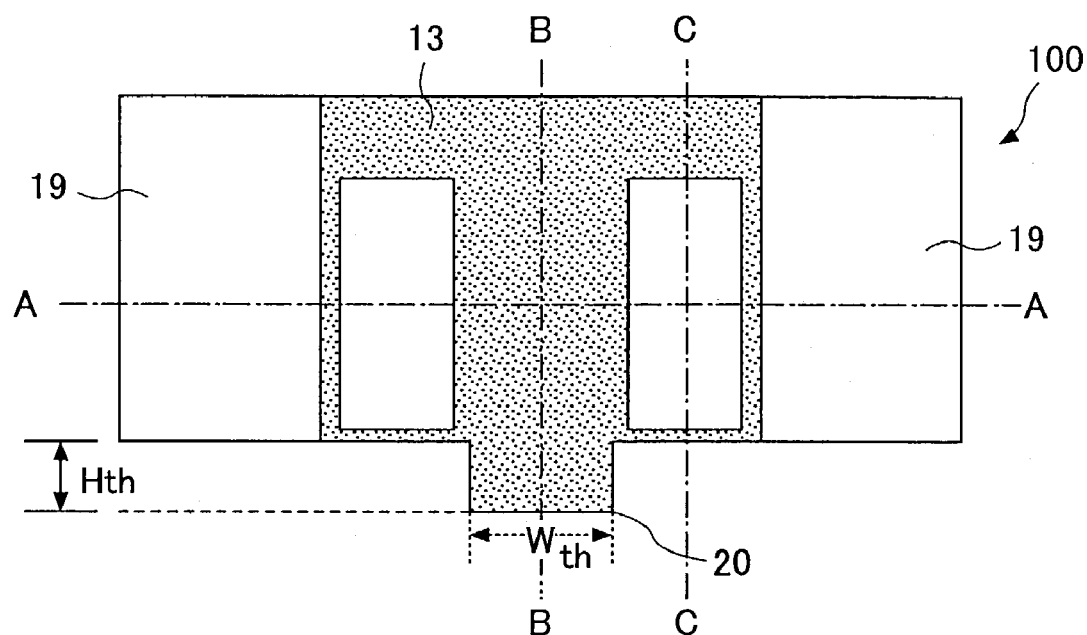
FIG. 3A through FIG. 3D show a first embodiment of the present invention.
Figure 3B:
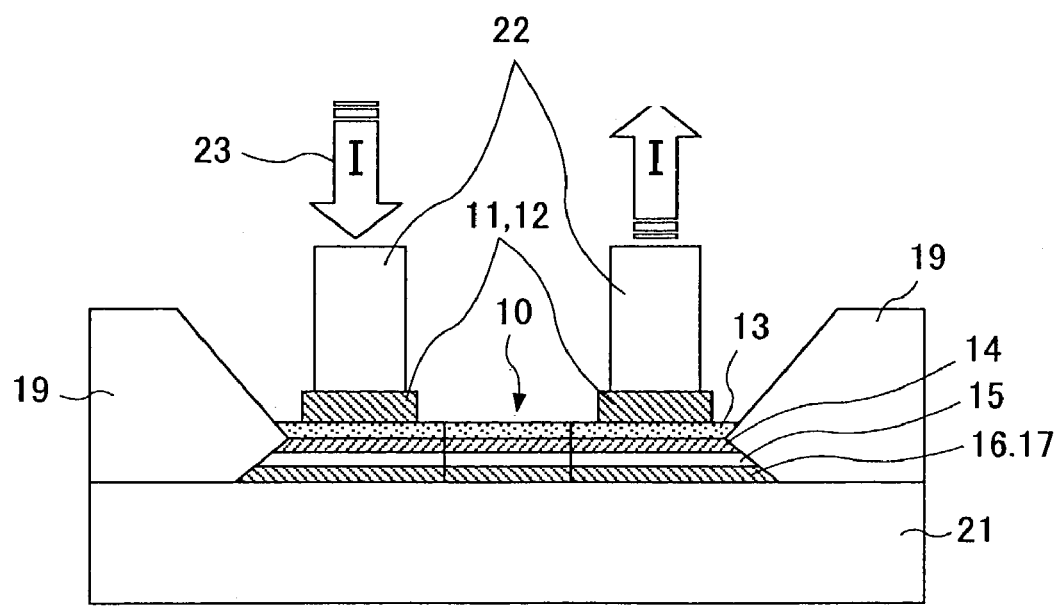
Figure 3C:
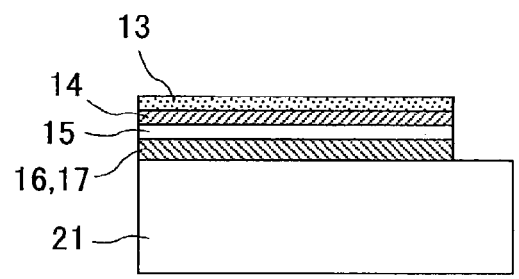
Figure 3D:
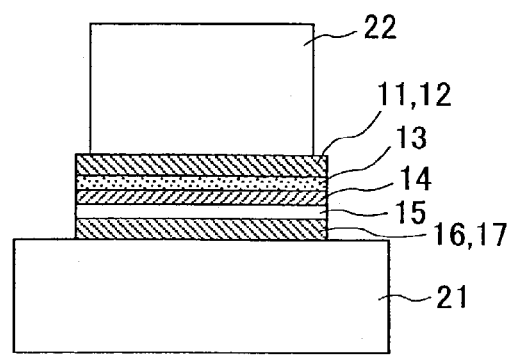

FIG. 3A through FIG. 3D show the first embodiment of the present invention. FIG. 3A through FIG. 3D show a magnetic head 100 that includes a triple composite type magnetoresistance effect element or magnetoresistive effect element that includes a TMR element, a SVMR element and another TMR element connected in series. FIG. 3A is a plan drawing of the magnetic head 100 viewed from the top. FIG. 3B is a sectional drawing showing the section A—A of FIG. 3A. FIG. 3C is a sectional drawing showing the section B—B of FIG. 3A. FIG. 3D is a sectional drawing showing the section C—C of FIG. 3A.

An outline composition of the magnetic head 100 is explained with reference to FIG. 3A through FIG. 3C. The magnetic head 100 includes a seed layer 21, on the upper surface of which a triple composite type magnetoresistive effect element 10 is arranged, on opposing sides of which, two hard magnetic films 19 and 19 are arranged, which are for forming the magnetization direction of a free magnetic layer 14 into a single magnetic region.

The triple composite type magnetoresistive effect element 10 takes a multilayer structure, wherein laminated objects 11 through 14 that form a tunnel element structure, and laminated objects 14 through 17 that form a spin valve element structure are laminated. In the present embodiment, the free magnetic layer 14 serves as a common layer, on the surface of which a tunnel type layer structure containing the lamination of a first anti-ferromagnetic layer 11, a first fixed magnetic layer 12, and a tunnel insulation layer 13 is formed; and on the bottom of which a spin valve type layer structure containing the lamination of a non-magnetic metal layer 15, a second fixed magnetic layer 16, and a second anti-ferromagnetic layer 17 is formed.

Further, the free magnetic layer 14 of the triple composite type magnetoresistive effect element 10 includes a flux guide 20. The flux guide 20 has height (the amount of projection) Hth, and width Wth. It is desirable that the width Wth be set at approximately the same as the track width of a magnetic recording medium.

The non-magnetic metal layer 15, the second fixed magnetic layer 16, and the second anti-ferromagnetic layer 17 under the free magnetic layer 14 are formed in the same form as the flux guide 20. Therefore, the SVMR element part has a projected form.

On the other hand, the upper part, which constitutes the TMR element, is bisected, with the position where the flux guide 20 is provided being in the center, one on the left and the other on the right, a first TMR element (TMR-1) and a second TMR element (TMR-2), respectively. As clearly shown in FIG. 3B, the first anti-ferromagnetic layer 11 and the first fixed magnetic layer 12 on the tunnel insulation layer 13, which constitute the TMR element structure, are bisected. On the upper surface of the first anti-ferromagnetic layer 11, an electrode 22 for applying sense current 23 is formed for each of the sections, namely, for each of TMR-1 and TMR-2.

Therefore, the triple composite type magnetoresistive effect element 10 shown in the present first embodiment is constituted by the first TMR element part, the SVMR element part, and the second TMR element part arranged in this order. The sense current 23 flows perpendicularly through the TMR-1 and TMR-2 in the lamination, and horizontally in the SVMR element part. As shown in FIG. 3B, the sense current 23, supplied from the electrode 22 on the left-hand side, the first TMR element part (TMR-1), flows perpendicularly, then horizontally through the SVMR section toward the right-hand side, then perpendicularly through the second TMR element part (TMR-2), and returns to the electrode 22 of the second TMR element part (TMR-2).

Figure 4:
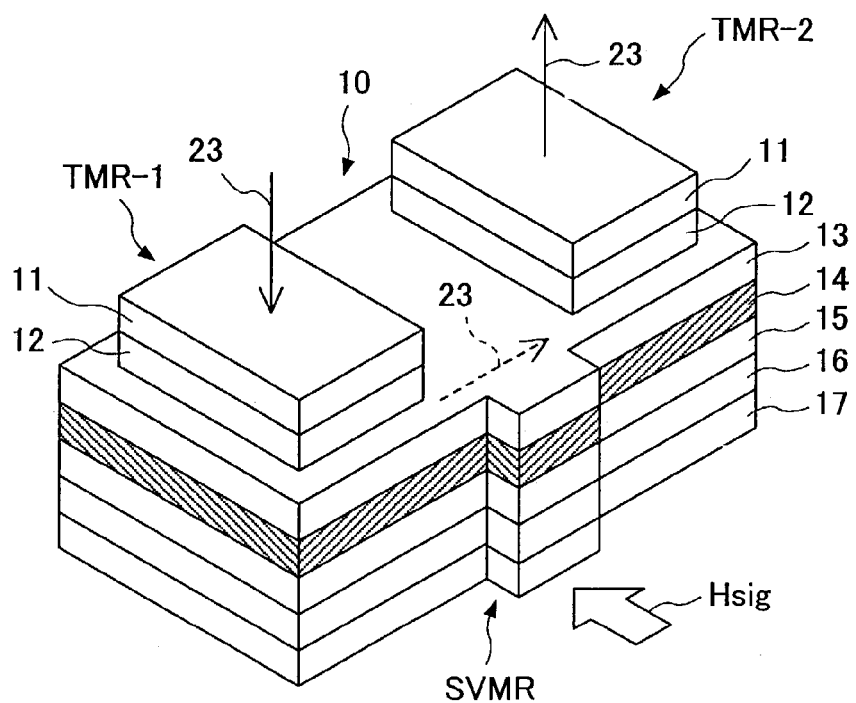
FIG. 4 is a detailed perspective diagram showing only a layer composition of the triple type magnetoresistive effect element as shown by FIGS. 3A through 3D.

FIG. 4 is a detailed perspective diagram showing only the layer structure of the triple composite type magnetoresistive effect element 10. FIG. 4 clearly shows that the structure is constituted by the TMR-1 element, the SVMR element, and the TMR-2 element parts arranged in this order. Since the three element parts are serially connected in the structure of the above triple composite type magnetoresistive effect element 10, the signal magnetic field Hsig (recorded data) of the magnetic recording medium is detected by totaling the magnetoresistive changes of the three element parts. In this manner, a large magnetoresistive change is obtained. As previously pointed out, making the tunnel insulation layer 13 thin, and using weak oxidization in order to reduce the junction resistance of a TMR element as low as a SVMR element conventionally caused the problems. However, according to the present embodiment, the triple composite type magnetoresistive effect element 10 as a whole is capable of detecting the external magnetic field Hsig (recorded data) with high sensitivity.

Figure 5:
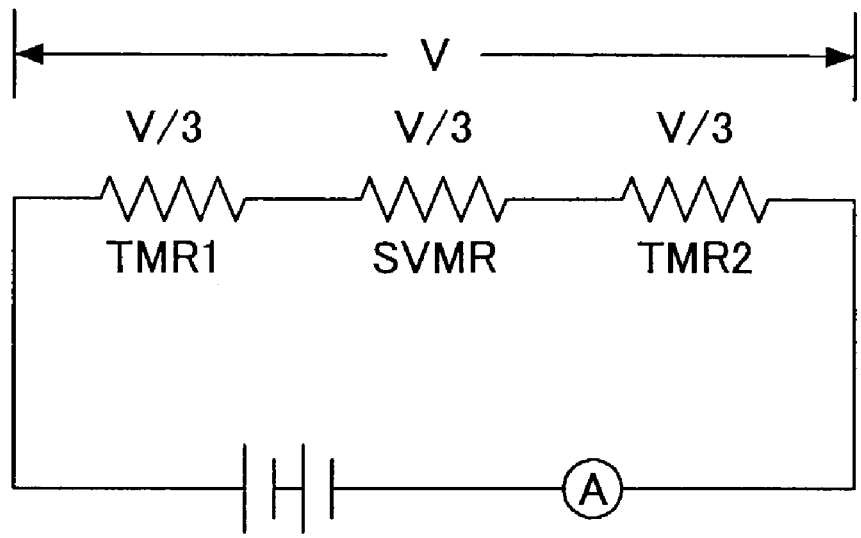
FIG. 5 is for explaining sharing of a voltage applied to the magnetoresistive element of the first embodiment.

Further, for example, if electrical resistances of the first TMR element part, the SVMR element part and the second TMR element part are made approximately equal to each other, a voltage applied to the triple composite type magnetoresistive effect element 10 is equally dropped through the three element parts as shown in a FIG. 5. Therefore, the voltage drop across each element part becomes small, and the voltage dependency of the TMR element can be remarkably alleviated.

Furthermore, since the flux guide part of the triple composite type magnetoresistive effect element 10 of the present embodiment contains the SVMR element part, the SVMR element part receives magnetic flux from the magnetic recording medium efficiently. Therefore, as compared with the conventional implementation wherein the free magnetic layer is simply provided with a flux guide structure, sensitivity, and therefore, reproduction output of the present embodiment are higher.

The magnetic head 100 containing the triple composite type magnetoresistive effect element 10 can be manufactured using the conventional thin film formation technology. For example, each layer is manufactured one by one, and the lamination is manufactured by the sputtering method; and the flux guide structure and two TMR element parts are formed using an etching process, such as the ion milling method.

Here, although the tunnel insulation layer 13 of the triple composite type magnetoresistive effect element 10 is shown to cover the whole surface of the free magnetic layer 14 in FIG. 4, the tunnel insulation layer 13 is required only for the parts occupied by the first TMR element part (TMR-1) and the second TMR element part (TMR-2). That is, in places other than the above-mentioned parts, the tunnel insulation layer 13 is dispensable.

When forming the TMR-1 and TMR-2, all the layers are formed including the first anti-ferromagnetic layer 11 and the first fixed magnetic layer 12, and parts that are peripheral to the TMR-1 and TMR-2 are removed by the ion milling method, etc., until the tunnel insulation layer 13 is exposed. Then, at the same time, the SVMR element part including the free magnetic layer 14 is formed.

For the first anti-ferromagnetic layer and the second anti-ferromagnetic layer, anti-ferromagnetic material such as IrMn, PtMn, and PdPtMn can be used. Further, for the first fixed magnetic layer 12 and the second fixed magnetic layer 16, single layer magnetic material, such as CoFe, and laminated ferrimagnetic material, such as CoFe/Ru/CoFe, can be used. Further, for the non-magnetic metal layer 15, Cu can be used, for example. Further, for the magnetic recording medium 14, single layer magnetic material, such as CoFe, and a multilayered magnetic material such as NiFe/CoFe can be used.

Further, for the tunnel insulation layer 13, insulating aluminum compounds, such as AlOx, AlNx, and AlOxNy, and a laminated structure of AlOx and AlNx can be used. As a method of oxidizing or nitriding the aluminum layer, a natural oxidizing method and natural nitriding method, a radical oxidizing method, and a radical nitriding method can be used, after forming the aluminum layer by sputtering.

In order to remove the cause of bulk Barkhausen noise, the hard magnetic films 19 and 19, which are for forming the triple composite type magnetoresistive effect element 10 into a single magnetic region, are arranged to opposing ends of the resistance effect element 10. However, in order to prevent a short circuit between the free magnetic layer 14 and the first fixed magnetic layer 12, it is desirable to form an insulation layer that consists of alumina, etc., between the hard magnetic films 19 and 19 and the first fixed magnetic layer 12.

Figure 6:
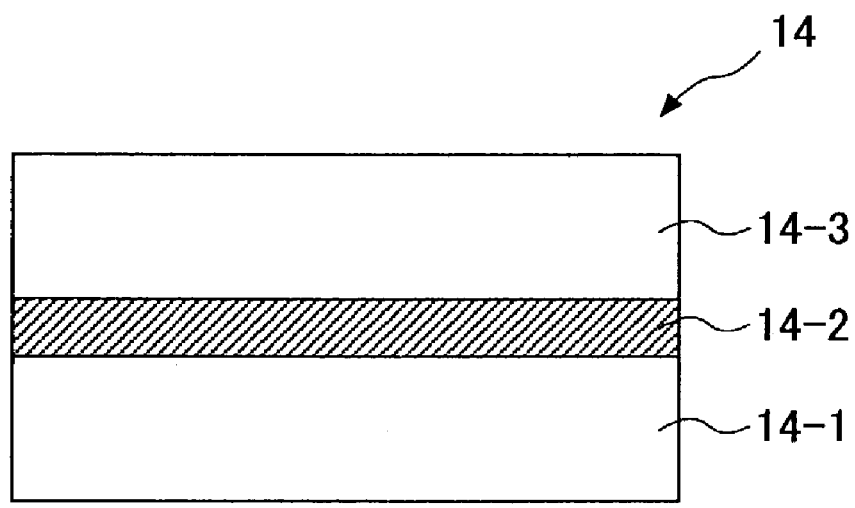
FIG. 6 shows an example of forming a free magnetic layer in layers.

FIG. 6 shows an example wherein the free magnetic layer 14 is structured by three layers, namely, a free magnetic layer 14-1 on the SVMR element side and another free magnetic layer 14-3 on the TMR element side, sandwiching an oxidization layer 14-2, such as FeOx and NiO. If the free magnetic layer 14 is formed in this manner, the free magnetic layer 14-1 on the SVMR element side can be made a specular type, and even higher sensitivity of the magnetoresistive effect element 10 can be attained.

As variations of the triple composite type magnetoresistive effect element 10 of the first embodiment, a structure wherein only the free magnetic layer 14 has a flux guide, and a structure wherein no flux guide is used are possible. In these cases, the problems with the TMR element are compensated for by the SVMR element part, and a high sensitivity magnetoresistive effect element is realized.

Figure 7:
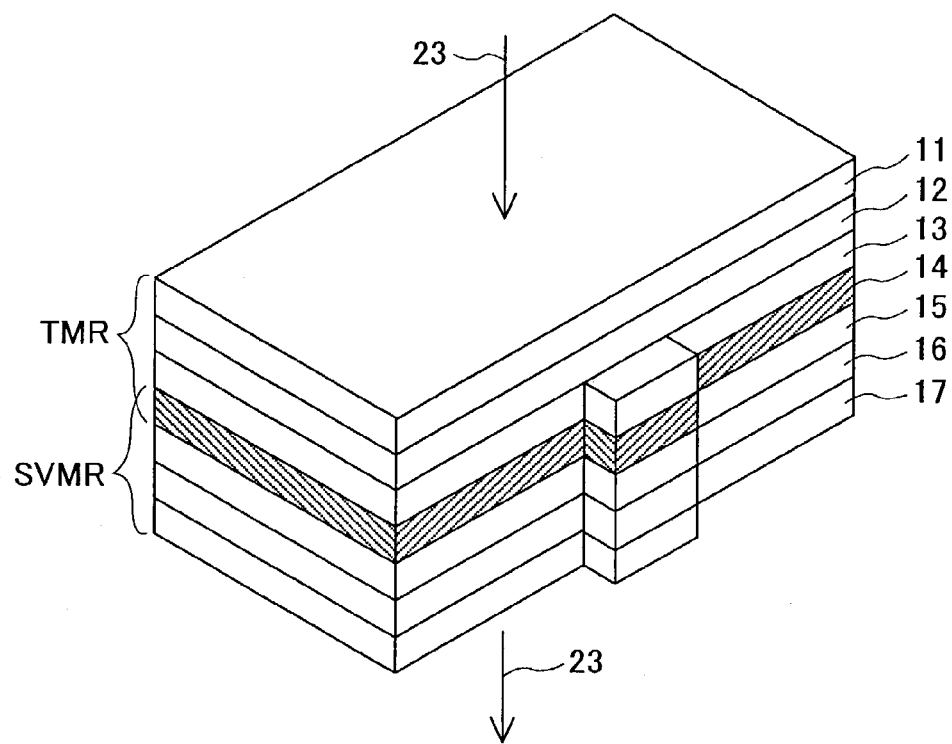
FIG. 7 shows the TMR-SVMR element according to a second embodiment of the present invention.

FIG. 7 shows the TMR-SVMR element according to the second embodiment of the present invention. In the present second embodiment, the TMR section is provided in the upper part, the SVMR section is provided in the lower part, and the free magnetic layer 14 is provided between the TMR section and the SVMR section. In the second embodiment, the same reference marks are given to the components that are the same as the first embodiment.

The second embodiment is the same as the first embodiment to the extent that the SVMR element part has the flux guide, however, in the second embodiment, the sense current 23 flows perpendicularly to the lamination through the TMR element part and the SVMR element part. In the structure of the second embodiment, the SVMR element, which has the flux guide, also compensates for the shortcomings of the TMR element, and a high sensitivity magnetoresistive effect element is available.

As a variation of the second embodiment, a structure wherein only the free magnetic layer 14 has a flux guide is also employable.

Figure 8:
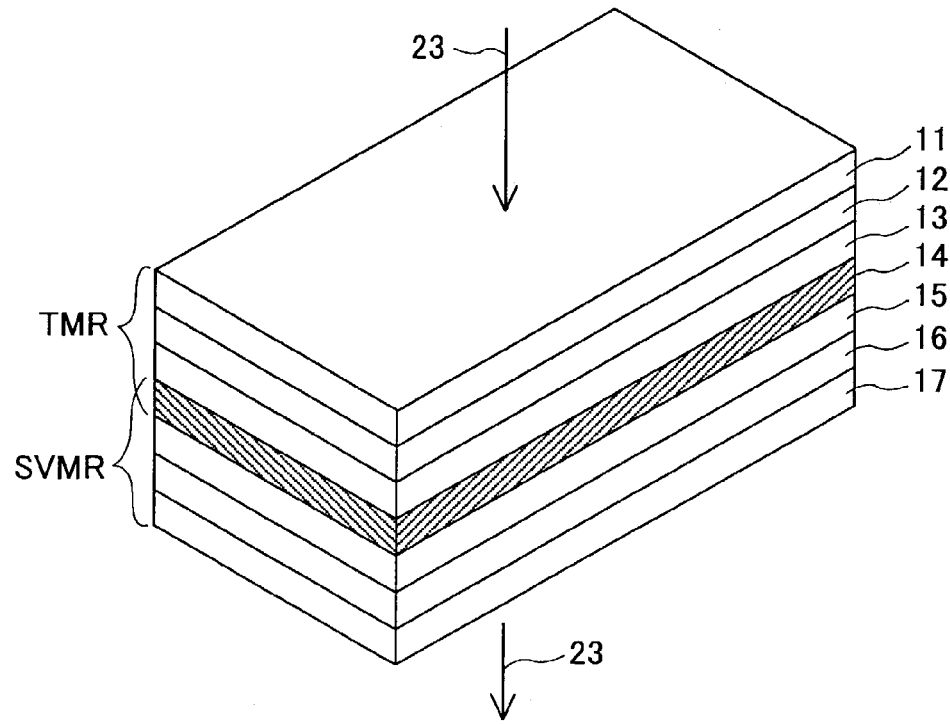
FIG. 8 shows the TMR-SVMR element according to a third embodiment of the present invention.

FIG. 8 shows the TMR-SVMR according to the third embodiment of the present invention. In this embodiment, the free magnetic layer 14, serving as the common layer, is also sandwiched by the TMR section provided in the upper part and the SVMR section provided in the lower part. In the third embodiment, the same reference marks are given to the components that are the same as the first embodiment.

Although the magnetoresistive element according to the third embodiment of the present invention is structured by simply compounding the TMR element and the SVMR element, a magnetoresistive element with high sensitivity is available, because the SVMR element is added to a conventional magnetoresistive element that is constituted only from a TMR element. The sense current 23 flows perpendicular to the lamination through the TMR element part and the SVMR element part.

Figure 9:
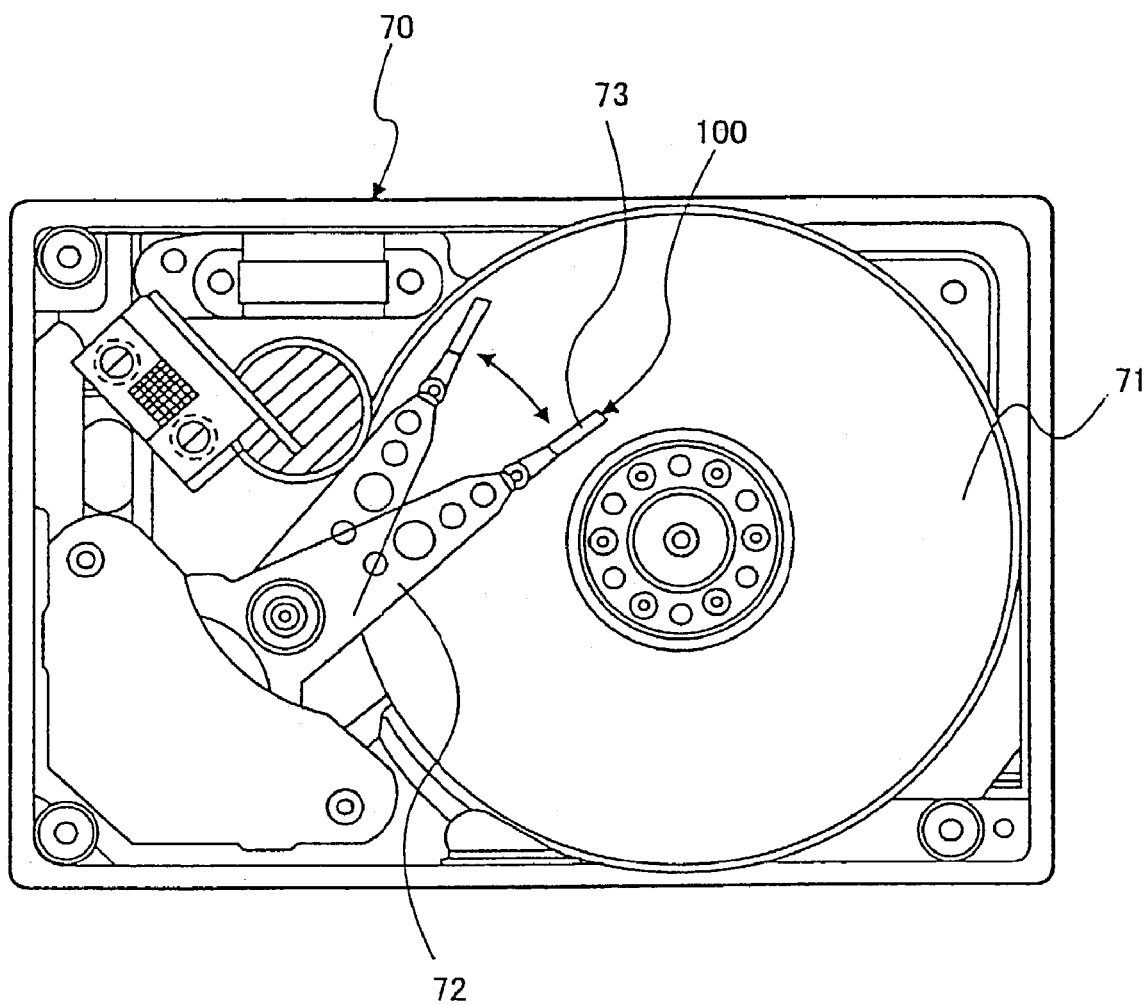
FIG. 9 shows the principal part of a magnetic recording and reproducing apparatus of the present invention.

Here, an example of the magnetic recording and reproducing apparatus 70 in which is installed the magnetic head 100 of the present invention is briefly explained. FIG. 9 shows the principal parts of the magnetic recording and reproducing apparatus 70. A hard disk 71 as a magnetic recording medium is installed in the magnetic recording and reproducing apparatus 70, and a rotational drive is carried out.

The SVMR element 10 scans the surface of the hard disk 71 at a predetermined floating height from the surface such that a magnetic reproduction operation is performed. In addition, the magnetic head 100 is fixed to the tip part of a slider 73 that is provided at the tip of an arm 72. As for the positioning of the magnetic head 100, a two-stage actuator can be used, which is constituted from an ordinary actuator and a microactuator. It is also possible to install a recording head in addition to the magnetic head 100 such that a magnetic head that is capable of recording and reproducing is realized.

INDUSTRIAL APPLICABILITY

Since the magnetic recording and reproducing apparatus 70 employs the magnetoresistive effect element consisting of the TMR-SVMR element, it can reproduce magnetically recorded data from the hard disk 71 with high sensitivity.

Although the preferred embodiments of the present invention are explained in full detail above, it cannot be overemphasized that the present invention is not limited to these embodiments, but various variations and modifications may be made without departing from the scope of the present invention.

The invention claimed is:

1. A magnetoresistive effect element, comprising:
   a TMR element having a first anti-ferromagnetic layer, a first fixed magnetic layer, a tunnel insulation layer, and a free magnetic layer adjoining the tunnel insulation layer; and
   an SVMR element having a non-magnetic metal layer adjoining the free magnetic layer on opposite side from the tunnel insulation layer, a second fixed magnetic layer, and a second anti-ferromagnetic layer;
   wherein the free magnetic layer is a common layer for both the TMR element and the SVMR element, and a sense current flows from the TMR element to the SVMR element.

2. The magnetoresistive effect element as claimed in claim 1, wherein the free magnetic layer comprises a magnetic flux guide.

3. The magnetoresistive effect element as claimed in claim 2, wherein the non-magnetic metal layer, the second fixed magnetic layer, and the second anti-ferromagnetic layer are shaped corresponding to the shape of the magnetic flux guide of the free magnetic layer.

4. The magnetoresistive effect element as claimed in claim 2, wherein at least the first fixed magnetic layer is bisected in the direction of the surface of the free magnetic layer at the position of the magnetic flux guide.

5. The magnetoresistive effect element as claimed in claim 4, wherein the non-magnetic metal layer, the second fixed magnetic layer, and the second anti-ferromagnetic layer are shaped corresponding to the shape of the magnetic flux guide of the free magnetic layer.

6. A magnetic head, comprising the magnetoresistive effect element as claimed in claim 1, a hard magnetic film for controlling a magnetic region of the free magnetic layer, and an electrode.

7. The magnetoresistive effect element as claimed in claim 1, wherein an oxidization layer for reflecting electrons is formed on the surface of the free magnetic layer, which is bisected in the direction of laminating.

8. A magnetic head, comprising the magnetoresistive effect element as claimed in claim 7, a hard magnetic film for controlling a magnetic region of the free magnetic layer, and an electrode.

9. A magnetic recording and reproducing apparatus, comprising the magnetic head as claimed in claim 6.

10. A magnetic recording and reproducing apparatus, comprising the magnetic head as claimed in claim 8.

* * * * *